US011387530B2

(12) United States Patent
Wang et al.

(10) Patent No.: US 11,387,530 B2
(45) Date of Patent: Jul. 12, 2022

(54) PHASE SHIFT COMPENSATION DEVICE FOR DETECTING AND ADJUSTING AN ACTUAL DIELECTRIC CONSTANT IN A LIQUID CRYSTAL PHASE SHIFTER

(71) Applicant: BOE TECHNOLOGY GROUP CO., LTD., Beijing (CN)

(72) Inventors: Hongrun Wang, Beijing (CN); Kai Hou, Beijing (CN); Liwei Liu, Beijing (CN); Feng Liao, Beijing (CN); Shunhang Zhang, Beijing (CN); Hui Zhang, Beijing (CN); Yu'E Jia, Beijing (CN); Yun Sik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/041,535

(22) PCT Filed: Apr. 15, 2020

(86) PCT No.: PCT/CN2020/084903
§ 371 (c)(1),
(2) Date: Sep. 25, 2020

(87) PCT Pub. No.: WO2020/248703
PCT Pub. Date: Dec. 17, 2020

(65) Prior Publication Data
US 2021/0210827 A1  Jul. 8, 2021

(30) Foreign Application Priority Data
Jun. 14, 2019 (CN) .......................... 201910516389.8

(51) Int. Cl.
*H01P 1/18* (2006.01)
*H03H 11/20* (2006.01)

(52) U.S. Cl.
CPC ............... *H01P 1/181* (2013.01); *H01P 1/18* (2013.01); *H01P 1/184* (2013.01); *H03H 11/20* (2013.01)

(58) Field of Classification Search
CPC .. H01P 1/181; H01P 1/184; H01P 1/18; H01P 9/00; H01P 9/006; H01Q 3/36; H03H 11/20
(Continued)

(56) References Cited

U.S. PATENT DOCUMENTS 5,237,629 A    8/1993  Hietala et al.
2009/0073332 A1  3/2009  Irie
(Continued)

FOREIGN PATENT DOCUMENTS

CN    101073179 A    11/2007
CN    106654470 A    5/2017
(Continued)

*Primary Examiner* — Benny T Lee
(74) *Attorney, Agent, or Firm* — Chiwin Law LLC

(57) ABSTRACT

A phase shifter, a phase shift degree compensation device, and a phase shift degree compensation method are provided. The phase shifter includes a first substrate and a second substrate that are oppositely arranged, a resonant circuit, a signal line, and a first alignment layer are on a side of the first substrate facing the second substrate, a conductive layer and a second alignment layer are on a side of the second substrate facing the first substrate, a liquid crystal layer is between the first alignment layer and the second alignment layer, and the resonant circuit is configured to detect an actual equivalent dielectric constant of the liquid crystal layer.

20 Claims, 4 Drawing Sheets

(58) Field of Classification Search
USPC .................................................. 333/156, 161
See application file for complete search history.

(56) References Cited

U.S. PATENT DOCUMENTS

2019/0372221 A1* 12/2019 Wu et al. ............... H04B 17/21
2020/0213017 A1*  7/2020 Lee et al. ............... H04B 17/12

FOREIGN PATENT DOCUMENTS

| CN | 107394318 A  | 11/2017 |
| CN | 108490270 A  |  9/2018 |
| CN | 108828811 A  | 11/2018 |
| CN | 208654481 U  |  3/2019 |
| CN | 208655852 U  |  3/2019 |
| CN | 110233315 A  |  9/2019 |
| EP |   3010083 A1 |  4/2016 |

\* cited by examiner

PHASE SHIFT COMPENSATION DEVICE FOR DETECTING AND ADJUSTING AN ACTUAL DIELECTRIC CONSTANT IN A LIQUID CRYSTAL PHASE SHIFTER

CROSS-REFERENCE TO RELATED APPLICATION

This application is a U.S. National Phase Entry of International Application No. PCT/CN2020/084903 filed on Apr. 15, 2020, designating the United States of America and claiming priority to Chinese Patent Application No. 201910516389.8, filed on Jun. 14, 2019. The present application claims priority to and the benefit of the above-identified applications and the above-identified applications are incorporated by reference herein in their entirety.

TECHNICAL FIELD

Embodiments of the present disclosure relate to the field of liquid crystal devices, in particular to the field of phase shifters, and in particular to a phase shifter, a phase shift degree compensation device, and a phase shift degree compensation method.

BACKGROUND

A phase shifter is a device that can adjust the phase of a wave, and the phase shifter is widely applied to radar, missile attitude control, accelerator, communications, instrumentation, music, and other fields. In a case where the microwave propagates in medium, the change of the dielectric constant of the medium will change the phase of the microwave. Materials whose dielectric constant changes with voltage, such as liquid crystal materials and ferroelectric materials, are filled between a microstrip line and a ground line. In a case where different voltages are applied between the microstrip line and the ground line, the materials between the microstrip line and the ground line will have different dielectric constants, thus achieving the purpose of phase shifting.

SUMMARY OF THE INVENTION

Some embodiments of the present disclosure provide a phase shifter comprising a first substrate and a second substrate that are oppositely arranged, a resonant circuit, a signal line, and a first alignment layer are on a side of the first substrate facing the second substrate, a conductive layer and a second alignment layer are on a side of the second substrate facing the first substrate, and a liquid crystal layer is between the first alignment layer and the second alignment layer, and the resonant circuit is configured to detect an actual dielectric constant of the liquid crystal layer.

For example, in the phase shifter provided by an embodiment of the present disclosure, the resonant circuit comprises an input line, a resonant structure, and an output line, a first coupling capacitor is electrically connected between the input line and the resonant structure, and a second coupling capacitor is electrically connected between the resonant structure and the output line.

For example, in the phase shifter provided by an embodiment of the present disclosure, the resonant structure is between the input line and the output line in a direction parallel to the first substrate.

For example, in the phase shifter provided by an embodiment of the present disclosure, the resonant structure comprises a metal strip, and in a direction parallel to the first substrate, a first end of the metal strip is electrically connected to a first coupling capacitor and a second end of the metal strip is electrically connected to a second coupling capacitor.

For example, in the phase shifter provided by an embodiment of the present disclosure, the resonant circuit further comprises a microwave source, a vector analyzer, and a processor, the microwave source is configured to output a second input alternating current microwave signal to the input line and the vector analyzer, the vector analyzer is configured to receive a second output alternating current microwave signal output from the output line, and analyze the second input alternating current microwave signal and the second output alternating current microwave signal to obtain an analysis result; and the processor is configured to process the analysis result to obtain the actual dielectric constant.

For example, in the phase shifter provided by an embodiment of the present disclosure, in a direction perpendicular to the first substrate, the resonant circuit and the signal line are between the first alignment layer and the first substrate, and are covered by the first alignment layer.

For example, in the phase shifter provided by an embodiment of the present disclosure, in a direction perpendicular to the second substrate, the conductive layer is between the second alignment layer and the second substrate, and is covered by the second alignment layer.

For example, in the phase shifter provided by an embodiment of the present disclosure, the conductive layer is grounded.

Some embodiments of the present disclosure further provide a phase shift degree compensation device, applied to the phase shifter described in any one of the above embodiments, the phase shift degree compensation device comprises a loading circuit, an acquisition circuit, and a control circuit, the loading circuit is configured to load a direct-current bias voltage and a first alternating current microwave signal in a signal line of the phase shifter, the acquisition circuit is configured to acquire a target equivalent dielectric constant of the liquid crystal layer of the phase shifter according to the direct-current bias voltage; the resonant circuit is configured to detect the actual dielectric constant of the liquid crystal layer of the phase shifter, and the control circuit is configured to adjust the direct-current bias voltage according to the target equivalent dielectric constant and the actual dielectric constant, to make the actual dielectric constant approach the target equivalent dielectric constant.

For example, in the phase shift degree compensation device provided by an embodiment of the present disclosure, the control circuit is configured to reduce the direct-current bias voltage in a case where the actual dielectric constant is greater than the target dielectric constant and increase the direct-current bias voltage in a case where the actual dielectric constant is less than the target dielectric constant.

For example, in the phase shift degree compensation device provided by an embodiment of the present disclosure, in a case where the resonant circuit comprises an input line, a resonant structure, and an output line, the resonant circuit is configured to, after inputting a second input alternating current microwave signal to the input line, detect to obtain the actual dielectric constant of the liquid crystal layer according to the second input alternating current microwave signal and a second output alternating current microwave signal output by the output line.

For example, in the phase shift degree compensation device provided by an embodiment of the present disclosure, in a case where the resonant circuit further comprises a microwave source, a vector analyzer, and a processor, the microwave source is configured to output the second input alternating current microwave signal to the input line and the vector analyzer, the vector analyzer is configured to receive the second output alternating current microwave signal output from the output line and analyze the second input alternating current microwave signal and the second output alternating current microwave signal to obtain an analysis result; and the processor is configured to process the analysis result to obtain the actual dielectric constant.

Some embodiments of the present disclosure further provide a phase shift degree compensation method, applied to the phase shift degree compensation device described in any one of the above embodiments, and the phase shift degree compensation method comprises: loading the direct-current bias voltage and the first alternating current microwave signal into the signal line; acquiring the target equivalent dielectric constant of the liquid crystal layer according to the direct-current bias voltage; detecting the actual dielectric constant of the liquid crystal layer, and adjusting the direct-current bias voltage according to the target equivalent dielectric constant and the actual dielectric constant, to make the actual dielectric constant approach the target equivalent dielectric constant.

For example, in the phase shift degree compensation method provided by an embodiment of the present disclosure, adjusting the direct-current bias voltage comprises: in a case where the actual dielectric constant is greater than the target dielectric constant, reducing the direct-current bias voltage; and in a case where the actual dielectric constant is less than the target dielectric constant, increasing the direct-current bias voltage.

For example, in the phase shift degree compensation method provided by an embodiment of the present disclosure, detecting the actual dielectric constant of the liquid crystal layer comprises: after inputting a second input alternating current microwave signal to an input line of the resonant circuit, detecting to obtain the actual dielectric constant of the liquid crystal layer according to the second input alternating current microwave signal and a second output alternating current microwave signal output by the output line of the resonant circuit.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

Figure 1:
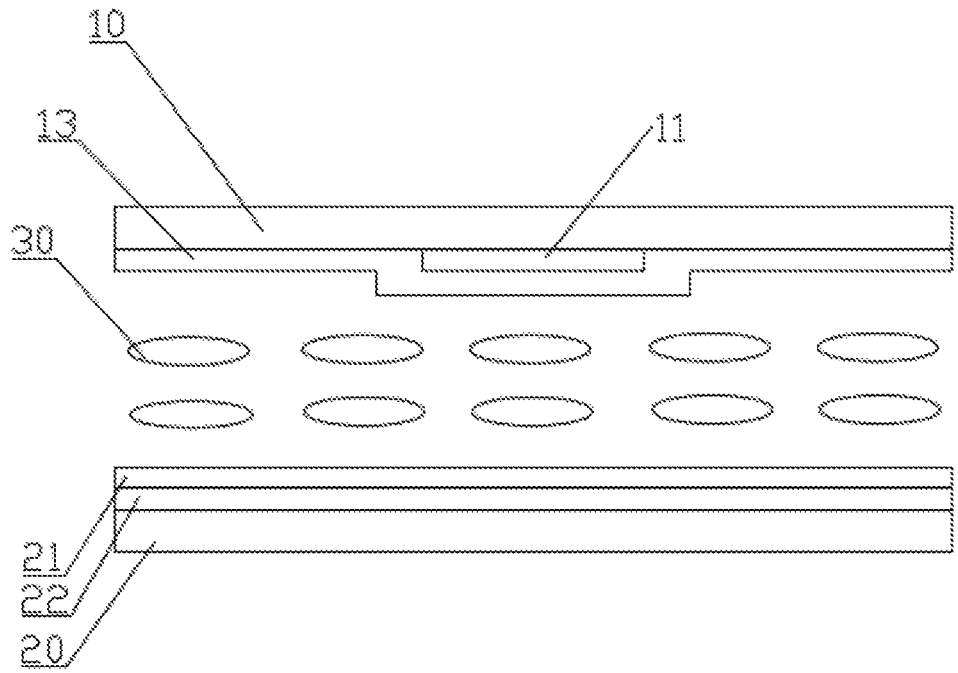
FIG. 1 is a structural schematic diagram of a conventional phase shifter.

Reference number: 10—first substrate, 11—signal line, 12—resonant circuit, 13—first alignment layer, 14—input line, 15—first coupling capacitor, 16—resonant structure, 17—output line, 18—second coupling capacitor, 20—second substrate, 21—second alignment layer, 22—conductive layer, 30—liquid crystal layer.

DETAILED DESCRIPTION OF THE INVENTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure will be further described in detail below in conjunction with the drawings and embodiments. It can be understood that the specific embodiments described here are only used to explain related inventions, but not to limit the invention. In addition, it should be noted that, for convenience of description, only the parts related to the invention are shown in the drawings.

It should be noted that, in a case where the embodiments do not conflict with each other, the embodiments in the present disclosure and the features in the embodiments can be combined with each other. Hereinafter, the present disclosure will be described in detail with reference to the drawings and in combination with embodiments.

The liquid crystal phase shifter uses the dielectric anisotropy of liquid crystal molecules to adjust the phase of the microwave. As a phase shift medium, the rotation of the liquid crystal molecules will be reflected in a phase shift degree, while the liquid crystal molecules themselves will be deflected to a certain extent under the influence of microwave signals or the external environment, especially in the case of high-power signal feeding, which will cause the rotation angle of the liquid crystal molecules to change and the phase shift degree to shift.

At least some embodiments of that present disclosure provide a phase shifter, a phase shift degree compensation device, and a phase shift degree compensation method. The phase shifter comprises a first substrate and a second substrate that are oppositely arranged, a resonant circuit, a signal line, and a first alignment layer are on a side of the first substrate facing the second substrate, a conductive layer and a second alignment layer are on a side of the second substrate facing the first substrate, a liquid crystal layer is between the first alignment layer and the second alignment layer, and the resonant circuit is configured to detect an actual dielectric constant of the liquid crystal layer.

In the technical scheme provided by the embodiments of the present disclosure, a direct-current bias voltage is loaded in a signal line to deflect the liquid crystal molecules of the liquid crystal layer, a target equivalent dielectric constant of the liquid crystal layer is obtained according to the direct-current bias voltage, the actual dielectric constant of the liquid crystal layer is detected by the resonant circuit, and then the direct-current bias voltage loaded in the signal line is adjusted to enable the actual dielectric constant to approach the target equivalent dielectric constant, thereby achieving the compensation of phase shift degree, ensuring that the rotation of the liquid crystal molecules is not affected by the feed-in signal and the external environment, and improving the accuracy of adjusting, by the phase shifter, the phase of the wave, so that under the conditions of high-power microwave feeding and temperature changing, the phase shifter can be unaffected by external factors, still accurately shift the phase of the wave, and thus solve the problem that the phase shift degree of the existing phase shifter is deviated due to the influence of the microwave signal or the external environment. It should be noted that the target equivalent dielectric constant is the equivalent dielectric constant corresponding to the ideal deflection angle of the liquid crystal molecules under ideal conditions. That is, the target equivalent dielectric constant represents the equivalent dielectric constant of the liquid crystal layer expected by a user in the case of shifting the phase of the microwave signal. For example, in a case where the equivalent dielectric constant of the liquid crystal layer is the target equivalent dielectric constant, after the phase shifter is used to adjust the phase of the microwave signal, the phase of the microwave signal is the phase expected by the user.

Figure 4A:
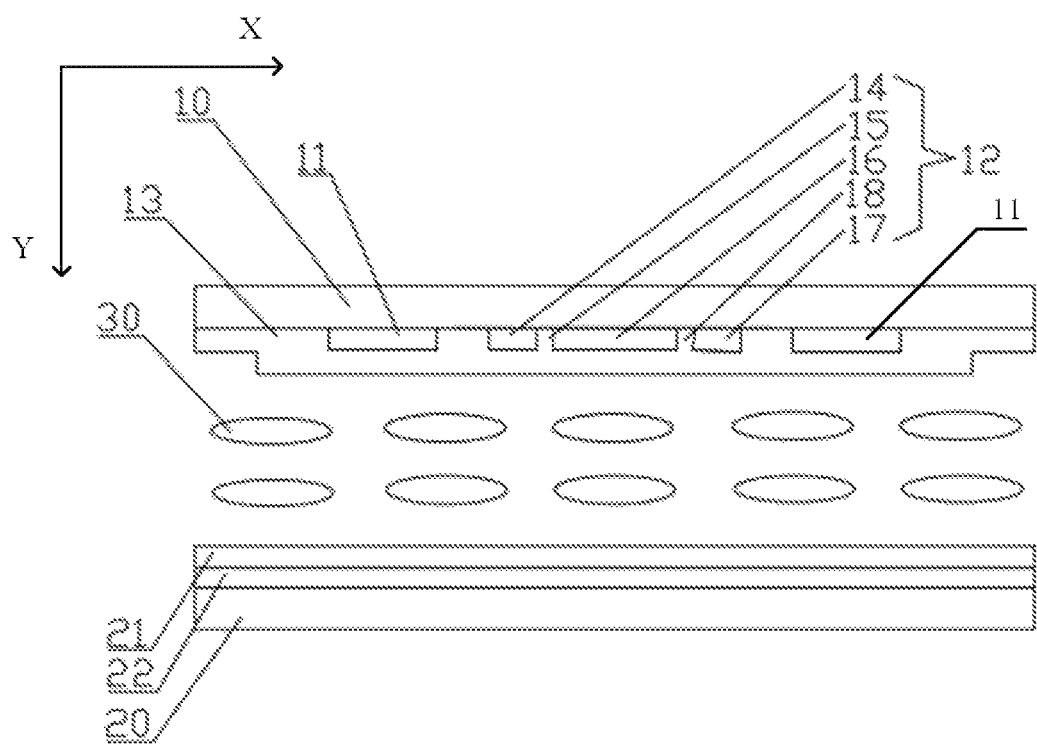
FIG. 4A is a structural schematic diagram of a phase shifter provided by an embodiment of the present disclosure.
Figure 4B:
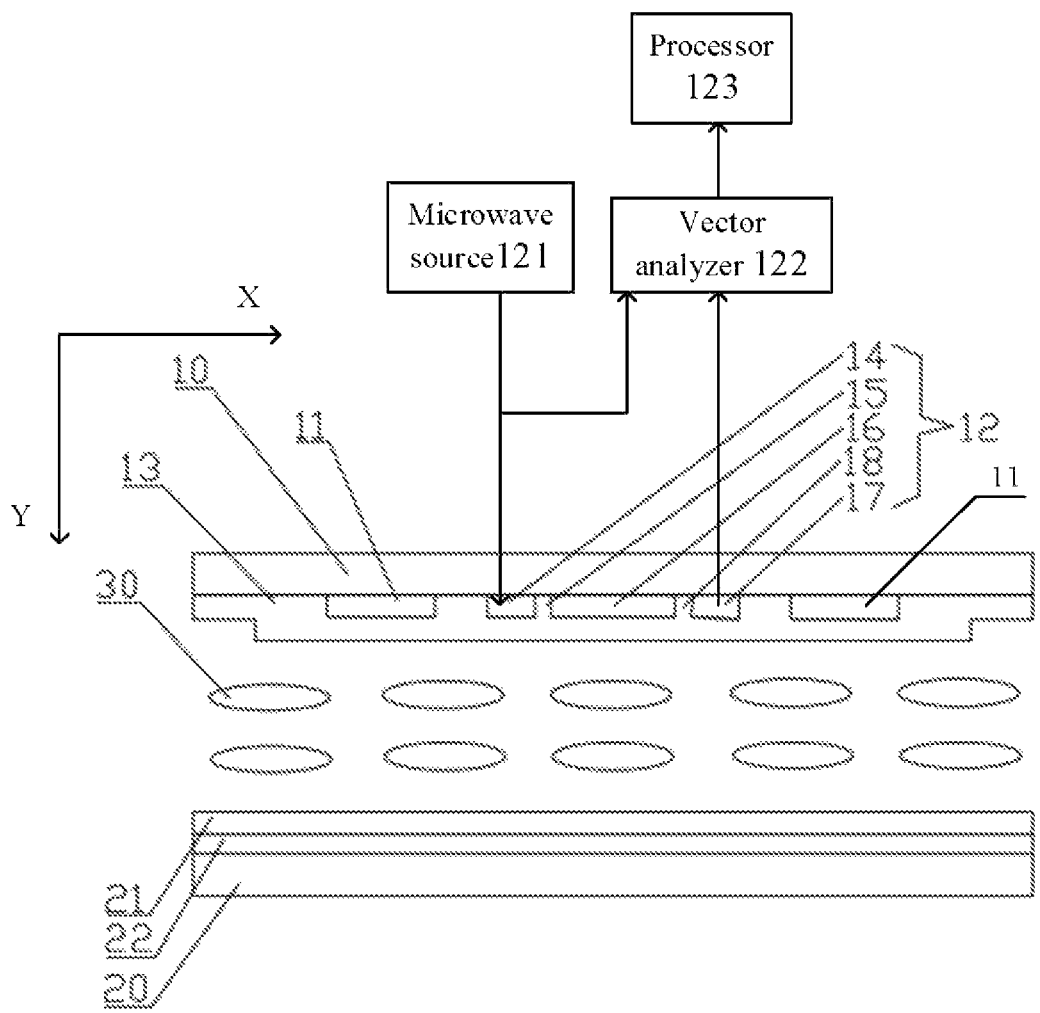
FIG. 4B is a structural schematic diagram of another phase shifter provided by an embodiment of the present disclosure.

For example, referring to FIG. 4A and FIG. 4B, a phase shifter provided by an embodiment of the present disclosure includes a first substrate 10 and a second substrate 20 that are oppositely arranged. A resonant circuit 12, a signal line 11, and a first alignment layer 13 are sequentially arranged on a side of the first substrate 10 facing the second substrate 20, a conductive layer 22 and a second alignment layer 21 are sequentially arranged on a side of the second substrate 20 facing the first substrate 10, and a liquid crystal layer 30 is arranged between the first alignment layer 13 and the second alignment layer 21.

For example, in a direction perpendicular to the first substrate, i.e., in a Y direction as shown in FIG. 4A and FIG. 4B, the resonance circuit 12 and the signal line 11 are located between the first alignment layer 13 and the first substrate 10, and both are covered by the first alignment layer 13. That is, the signal line 11 and the resonance circuit 12 are arranged between the first alignment layer 13 and the first substrate 10. As shown in FIG. 4A, the resonant circuit 12 and the signal lines 11 are arranged on the same layer, and the resonant circuit 12 is located between two adjacent signal lines 11.

For example, in a direction perpendicular to the second substrate, that is, in the Y direction as shown in FIG. 4A and FIG. 4B, the conductive layer 22 is located between the second alignment layer 21 and the second substrate 20 and covered by the second alignment layer 21. For example, the conductive layer 22 has a planar structure, and the conductive layer 22 covers the whole surface of the second substrate 20.

In the embodiment of the present disclosure, both the first alignment layer 13 and a second alignment layer 14 are in direct contact with the liquid crystal layer 30 to align the orientation of the liquid crystal layer 30. The direct-current bias voltage is applied to the signal line 11 to deflect the liquid crystal molecules of the liquid crystal layer 30, and the target equivalent dielectric constant of the liquid crystal layer 30 is obtained according to the direct-current bias voltage applied to the signal line 11, the target equivalent dielectric constant is the ideal equivalent dielectric constant of the liquid crystal layer. For example, that equivalent dielectric constant of the liquid crystal layer 30 has a functional relationship with the voltage difference between the signal line 11 and the conductive layer 22, and the functional relationship can be obtained by testing, so that the target equivalent dielectric constant of the liquid crystal layer 30 can be determined according to the direct-current bias voltage applied to the signal line 11, and the target equivalent dielectric constant corresponds to the direct-current bias voltage applied to the signal line 11. In the case where a first alternating current microwave signal is transmitted in the signal line 11, the resonant circuit can obtain the actual dielectric constant of the liquid crystal layer 30, the actual dielectric constant is related to the actual deflection angle of the liquid crystal molecules in the liquid crystal layer 30. By adjusting the direct-current bias voltage in the signal line 11, the actual dielectric constant approaches the target equivalent dielectric constant, for example, the actual dielectric constant is equal to the target equivalent dielectric constant, thereby reducing or even eliminating the deviation of the phase shift degree caused by the influence of the microwave signals or external environment and other factors on the liquid crystal layer 30, achieving the compensation of the phase shift degree, and improving the accuracy of adjusting, by the phase shifter, the phase of the wave.

Figure 2:
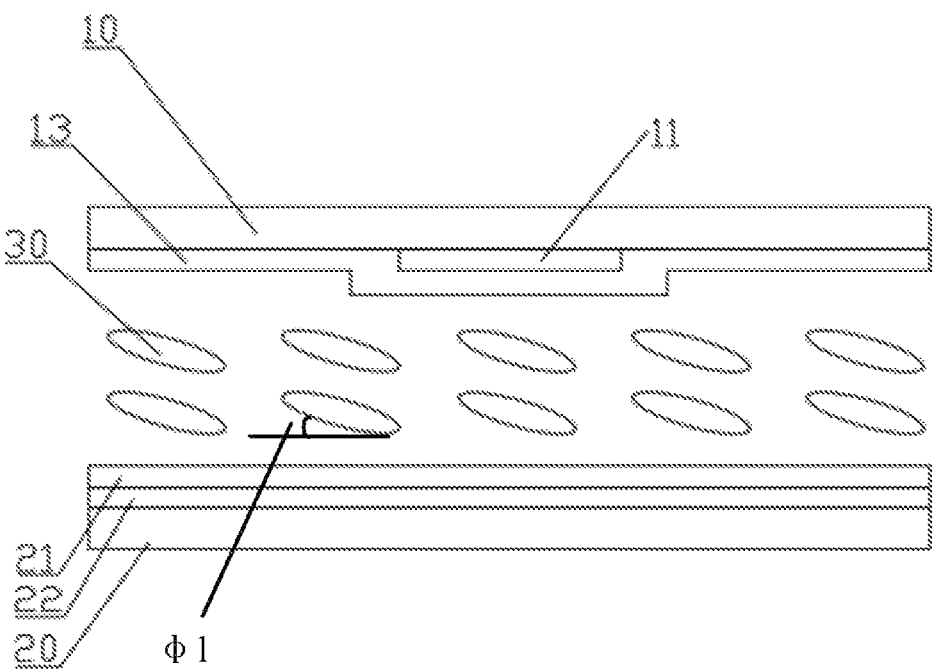
FIG. 2 is a structural schematic diagram of liquid crystal deflection of a conventional phase shifter under ideal conditions.
Figure 3:
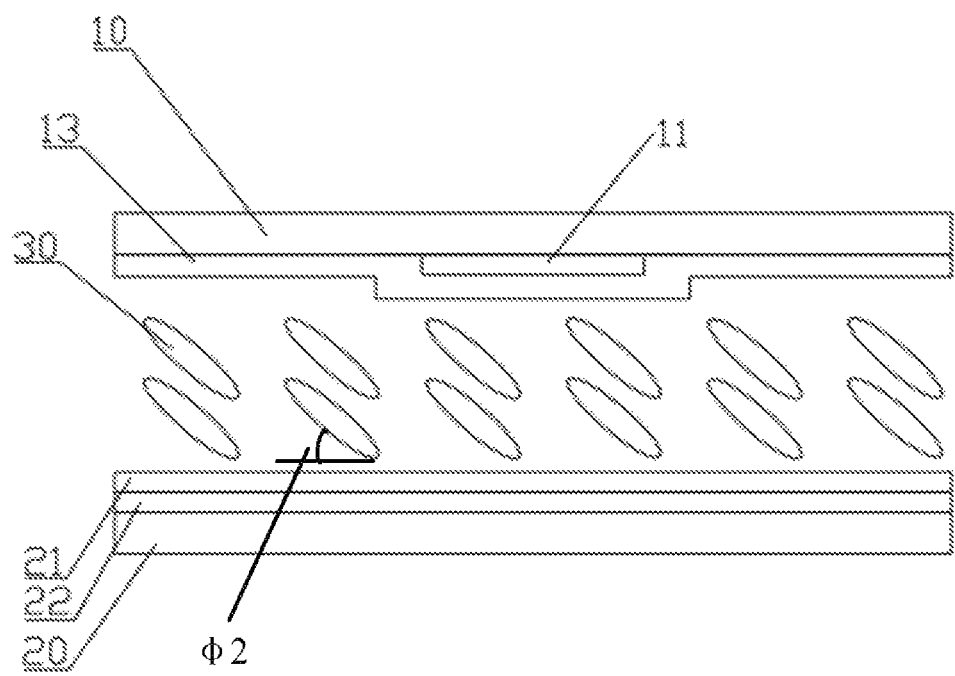
FIG. 3 is a structural schematic diagram of liquid crystal deflection of a conventional phase shifter under actual conditions.

FIG. 1 is a structural schematic diagram of a conventional phase shifter. FIG. 2 is a structural schematic diagram of liquid crystal deflection of a conventional phase shifter under ideal conditions; FIG. 3 is a structural schematic diagram of liquid crystal deflection of a conventional phase shifter under actual conditions. As shown in FIGS. 1-3, the phase shifter may include a first substrate 10 and a second substrate 20 that are oppositely arranged. A signal line 11 and a first alignment layer 13 is provided on a side of the first substrate 10 facing the second substrate 20; a conductive layer 22 and a second alignment layer 21 is provided on a side of the second substrate 20 facing the first substrate 10; and a liquid crystal layer 30 is arranged between the first alignment layer 13 and the second alignment layer 21. The deflection angle of the liquid crystal molecules in the liquid crystal layer 30 is related to the voltage difference between the signal line 11 and the conductive layer 22. For example, the larger the voltage difference between the signal line 11 and the conductive layer 22, the larger the deflection angle of the liquid crystal molecules in the liquid crystal layer 30, that is, after the liquid crystal molecules deflect, the included angle between the liquid crystal molecules and a horizontal direction (e.g., a direction parallel to the surface of the first substrate, i.e., the opposite direction of a X direction as shown in FIG. 4A and FIG. 4B) is larger.

For the phase shifter as shown in FIG. 1, in the case where no direct-current bias voltage is applied between the signal line 11 and the conductive layer 22, the included angle between the liquid crystal molecules and the horizontal direction is 0°. For the phase shifter as shown in FIG. 1, in the case where the direct-current bias voltage is applied between the signal line 11 and the conductive layer 22 (for example, the direct-current bias voltage is applied to the signal line 11, and the conductive layer 22 is grounded), the liquid crystal molecules will deflect in the direction as shown in FIG. 2 under ideal condition. For example, the liquid crystal molecules rotate clockwise by $\Phi 1$ degree, and in this case, the included angle between the liquid crystal molecules and the horizontal direction is $\Phi 1$ degree. However, because the liquid crystal molecules will be affected by the microwave signals or external environment, the liquid crystal molecules will deflect in the direction as shown in FIG. 3 in practice, that is, the liquid crystal molecules rotate clockwise by $\Phi 2$ degrees, and the included angle between the liquid crystal molecules and the horizontal direction is $\Phi 2$ degrees. $\Phi 1$ is not equal to $\Phi 2$, for example, as shown in FIGS. 2 and 3, $\Phi 1$ is smaller than $\Phi 2$. Because the rotation angle of the liquid crystal molecules is related to the phase shift degree, the phase shift degree is different in the case where the rotation angle is different, that is, the phase shift degree corresponding to $\Phi 1$ is different from the phase shift degree corresponding to $\Phi 2$, thereby resulting in phase shift deviation.

For example, as shown in FIG. 4A and FIG. 4B, the resonant circuit 12 includes an input line 14, a resonant structure 16, and an output line 17, which are arranged in sequence. A first coupling capacitor 15 is electrically connected between the input line 14 and the resonant structure 16, and a second coupling capacitor 18 is electrically connected between the resonant structure 16 and the output line 17.

For example, the resonant structure 16 is located between the input line 14 and the output line 17 in a direction parallel to the first substrate, that is, in the X direction as shown in FIG. 4A and FIG. 4B.

In the embodiment of the present disclosure, a second input alternating current microwave signal is input into the input line 14, the second input alternating current microwave signal can be coupled with the resonant structure 16 in the resonant circuit 12 to generate resonance. Specifically, the first coupling capacitor 15 is located between the input line 14 and the resonant structure 16, and the second coupling capacitor 18 is located between the resonant structure 16 and the output line 17. In a case where the second input alternating current microwave signal is input into the input line 14, the second input alternating current microwave signal will be coupled at the first coupling capacitor 15 and the second coupling capacitor 18, and the coupling effects on the first coupling capacitor 15 and the second coupling capacitor 18 will excite the resonant structure 16, thus forming resonance. The direct-current bias voltage applied on the signal line 11 is related to the equivalent dielectric constant of the liquid crystal layer 30, by adjusting the direct-current bias voltage in the signal line 11, the equivalent dielectric constant of the liquid crystal layer 30 can be changed. Different equivalent dielectric constants of the liquid crystal layer 30 have different influences on the resonant structure 16. In a case where the liquid crystal layer 30 has different equivalent dielectric constants, and the resonant frequencies of corresponding resonances generated by the resonant circuit 12 are different.

The first coupling capacitor 15 includes two first metal electrodes arranged at intervals and oppositely with each other, one of the two first metal electrodes is electrically connected to the input line 14, and the other of the two first metal electrodes is electrically connected to the resonant structure 16. The second coupling capacitor 18 includes two second metal electrodes arranged at intervals and oppositely with each other, one of the two second metal electrodes is electrically connected to the resonant structure 16, and the other of the two second metal electrodes is electrically connected to the output line 17. For example, in some embodiments, the first coupling capacitor 15 may be composed of an input line 14, a resonant structure 16, and a first alignment layer 13 between the input line 14 and the resonant structure 16. That is, the input line 14 and the resonant structure 16 are multiplexed as the two first metal electrodes of the first coupling capacitor 15, and the first alignment layer 13 between the input line 14 and the resonant structure 16 is also used as a dielectric layer of the first coupling capacitor 15. Similarly, the second coupling capacitor 18 may be composed of an output line 17, a resonant structure 16, and a first alignment layer 13 between the output line 17 and the resonant structure 16, that is, the output line 17 and the resonant structure 16 are multiplexed as the two second metal electrodes of the second coupling capacitor 18, and the first alignment layer 13 between the output line 17 and the resonant structure 16 is also used as a dielectric layer of the second coupling capacitor 18.

For example, the resonant structure 16 includes a metal strip, in the direction parallel to the first substrate, that is, in the X direction as shown in FIG. 4A, a first end of the metal strip is electrically connected to the first coupling capacitor 15, and a second end of the metal strip is electrically connected to the second coupling capacitor 18.

For example, as shown in FIG. 4B, in some embodiments, the resonant circuit 12 further includes a microwave source 121, a vector analyzer 122, and a processor 123. The microwave source 121 is configured to generate and output the second input alternating current microwave signal to the input line 14 and the vector analyzer 122. The vector analyzer 122 is configured to receive the second output alternating current microwave signal output from the output line 17 and analyze the second input alternating current microwave signal and the second output alternating current microwave signal to obtain an analysis result. The processor 123 is configured to process the analysis results to obtain the actual dielectric constant.

For example, the first alternating current microwave signal applied to the signal line 11 and the second input alternating current microwave signal applied to the input line 14 may be different. The first alternating current microwave signal represents a microwave signal that needs to be phase shifted, and the second input alternating current microwave signal is a microwave signal for testing the actual dielectric constant of the liquid crystal layer 30.

For example, the processor 123 may be a central processing unit (CPU), a tensor processor (TPU), and other devices having data processing capability and/or program execution capability. The processor 123 can process data signals, and can include various computing structures, such as a complex instruction set computer (CISC) structure, a reduced instruction set computer (RISC) structure, or a structure that performs a variety of instruction set combinations, etc.

It should be noted that the microwave source 121 can also generate and output the first alternating current microwave signal to the signal line 11.

For example, the conductive layer 22 is grounded, so that the electromotive force of the conductive layer 22 is zero. In the case of adjusting the voltage difference between the signal line 11 and the conductive layer 22, only the direct-current bias voltage applied to the signal line 11 needs to be adjusted, and the adjustment mode is simple and convenient.

Figure 5:
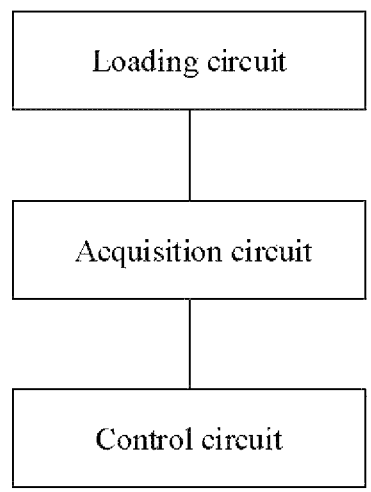
FIG. 5 is a structural schematic diagram of a phase shift degree compensation device provided by an embodiment of the present disclosure.

At least one embodiment of the present disclosure also provides a phase shift degree compensation device. The phase shift degree compensation device can be used to perform phase shifting compensation on the phase shifter provided in any of the above embodiments. For example, referring to FIG. 5, a phase shift degree compensation device includes a loading circuit, an acquisition circuit, and a control circuit. For example, the loading circuit, the acquisition circuit, and the control circuit are all electrically connected to the phase shifter. The loading circuit is electrically connected to the acquisition circuit, and the acquisition circuit is electrically connected to the control circuit.

For example, the loading circuit is configured to load the direct-current bias voltage and the first alternating current microwave signal in the signal line of the phase shifter.

The acquisition circuit is configured to acquire the target equivalent dielectric constant of the liquid crystal layer of the phase shifter according to the direct-current bias voltage.

The resonant circuit of the phase shifter is configured to obtain the actual dielectric constant of the liquid crystal layer of the phase shifter.

The control circuit is configured to adjust the direct-current bias voltage according to the target equivalent dielectric constant and the actual dielectric constant, so that the actual dielectric constant approaches the target equivalent dielectric constant, for example, making the actual dielectric constant basically equal to the target equivalent dielectric constant.

In the embodiment of the present disclosure, the liquid crystal molecules of the liquid crystal layer are deflected by loading the direct-current bias voltage in the signal line, the target equivalent dielectric constant of the liquid crystal layer is obtained according to the direct-current bias voltage loaded in the signal line, and the target equivalent dielectric constant is the ideal equivalent dielectric constant of the liquid crystal layer. In the case where the first alternating current microwave signal is transmitted in the signal line, the resonant circuit can obtain the actual dielectric constant of the liquid crystal layer, the actual dielectric constant is related to the actual deflection angle of liquid crystal molecules in the liquid crystal layer. By adjusting the direct-current bias voltage in the signal line, the actual dielectric constant approaches the target equivalent dielectric constant, for example, making the actual dielectric constant equal to the target equivalent dielectric constant, thus reducing or even eliminating the deviation of phase shift degree caused by the influence of the microwave signal or external environment on the liquid crystal layer, and achieving the compensation of phase shift degree, and improving the accuracy of adjusting, by the phase shifter, the phase of the wave. For example, in the case where the actual dielectric constant is greater than the target equivalent dielectric constant, it is necessary to reduce the direct-current bias voltage in the signal line, so as to reduce the actual dielectric constant; and in the case where the actual dielectric constant is less than the target equivalent dielectric constant, it is necessary to increase the direct-current bias voltage in the signal line, so as to increase the actual dielectric constant.

The target equivalent dielectric constant is the equivalent dielectric constant corresponding to the ideal deflection angle of the liquid crystal molecules under ideal conditions.

For example, the control circuit is configured to reduce the direct-current bias voltage in the case where the actual dielectric constant is greater than the target dielectric constant and increase the direct-current bias voltage in the case where the actual dielectric constant is less than the target dielectric constant. Therefore, the actual dielectric constant can approach the target equivalent dielectric constant, so as to achieve the compensation of phase shift degree, and improve the accuracy of adjusting, by the phase shifter, the phase of the wave.

For example, in the case where the resonant circuit includes an input line, a resonant structure, and an output line, the resonant circuit is configured to, after inputting a second input alternating current microwave signal to the input line, obtain the actual dielectric constant of the liquid crystal layer according to the second input alternating current microwave signal input to the input line and the second output alternating current microwave signal output by the output line.

For example, as shown in FIG. 4B, in the case where the resonant circuit further includes a microwave source 121, a vector analyzer 122, and a processor 123, the microwave source 121 is configured to output the second input alternating current microwave signal to the input line and the vector analyzer 122; the vector analyzer 122 is configured to receive the second output alternating current microwave signal output from the output line and analyze the second input alternating current microwave signal and the second output alternating current microwave signal to obtain an analysis result. The processor 123 is configured to process the analysis result to obtain the actual dielectric constant. For example, the second input alternating current microwave signal input to the input line and the second output alternating current microwave signal output by the output line can be input to the vector analyzer 122 for vector analysis to obtain the analysis result, and then the analysis result is processed by the processor 123 to obtain the actual dielectric constant of the liquid crystal layer.

For another example, the transmission coefficient curve of the second output alternating current microwave signal and the transmission coefficient curve of the known dielectric constant can also be fitted by a simulation method, and the dielectric constant corresponding to the transmission coefficient curve, which coincides with the transmission coefficient curve of the second output alternating current microwave signal, of the known dielectric constant is taken as the actual dielectric constant of the liquid crystal layer.

For example, in some embodiments of the present disclosure, the loading circuit, the acquisition circuit and/or the control circuit include codes and programs stored in a memory; the processor may execute the codes and programs to achieve some or all of the functions of the loading circuit, the acquisition circuit and/or the control circuit as described above. For another example, in some embodiments of the present disclosure, the loading circuit, the acquisition circuit and/or the control circuit may be dedicated hardware devices for achieving some or all functions of the loading circuit, the acquisition circuit and/or the control circuit as described above. For example, the loading circuit, the acquisition circuit and/or the control circuit may be one circuit board or a combination of a plurality of circuit boards for achieving the functions as described above. In an embodiment of the present disclosure, the one circuit board or the combination of the plurality of circuit boards may include: (1) one or more processors; (2) one or more non-transitory computer-readable memories connected to the processor, and (3) firmware stored in the memory and executed by the processor. The memory may store instructions and/or data executed by the processor. These instructions and/or data may include codes for implementing some or all of the functions of one or more devices described in embodiments of the present disclosure. For example, the memory includes dynamic random access memory (DRAM), static random access memory (SRAM), flash memory, optical memory, or other memories well known to those skilled in the art.

It should be noted that the specific description of the phase shifter can refer to the relevant descriptions in the above-mentioned embodiments of the phase shifter, and the similar portions are not repeated here.

Figure 6:
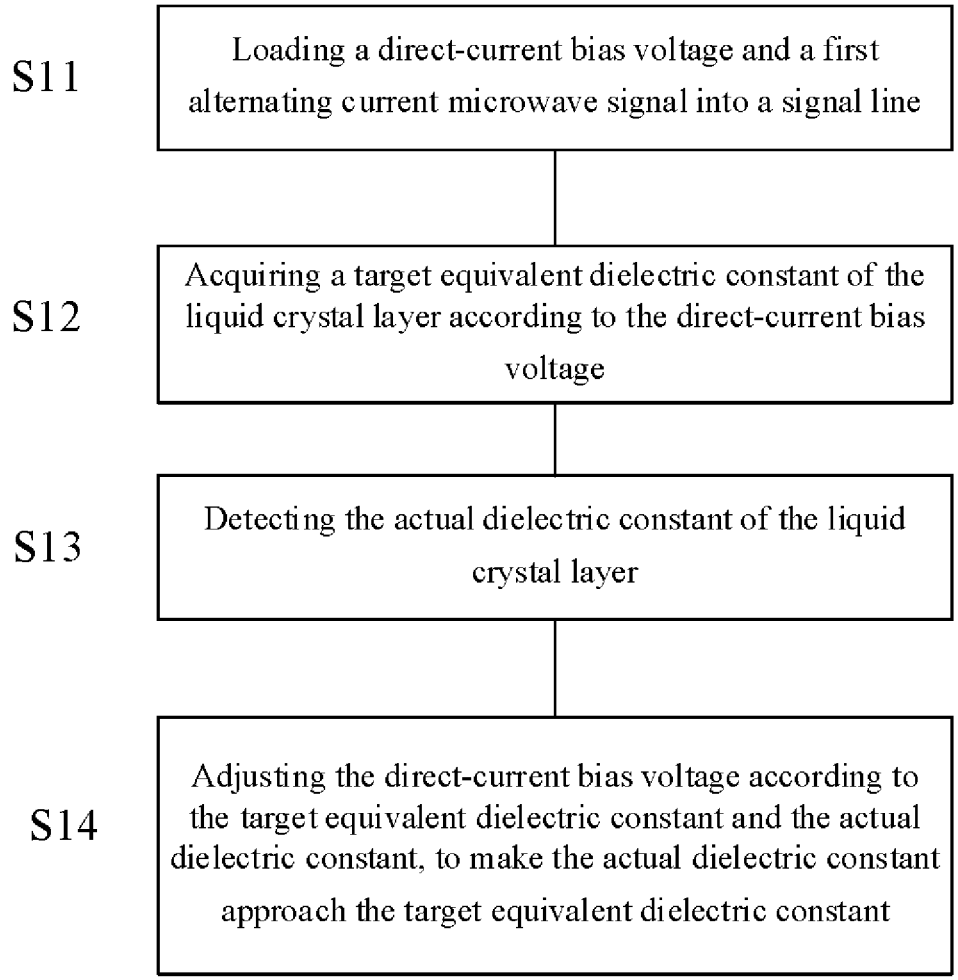
FIG. 6 is a schematic flowchart of a phase shift degree compensation method provided by an embodiment of the present disclosure.

At least one embodiment of the present disclosure also provides a phase shift degree compensation method, which can be applied to the phase shifter provided by any of the above embodiments. Referring to FIG. 6, a phase shift degree compensation method includes the following steps:

S11: loading a direct-current bias voltage and a first alternating current microwave signal into a signal line;

S12: acquiring a target equivalent dielectric constant of the liquid crystal layer according to the direct-current bias voltage;

S13: detecting the actual dielectric constant of the liquid crystal layer, and

S14: adjusting the direct-current bias voltage according to the target equivalent dielectric constant and the actual dielectric constant, to make the actual dielectric constant approach the target equivalent dielectric constant.

In an embodiment of the present disclosure, a direct-current bias voltage is applied to a signal line to deflect liquid crystal molecules of the liquid crystal layer, and a target equivalent dielectric constant of the liquid crystal layer is obtained according to the direct-current bias voltage applied to the signal line, and the target equivalent dielectric constant is an ideal equivalent dielectric constant of the liquid crystal layer. In the case where the first alternating current microwave signal is transmitted in the signal line, the resonant circuit can obtain the actual dielectric constant of the liquid crystal layer, the actual dielectric constant is related to the actual deflection angle of liquid crystal molecules in the liquid crystal layer. By adjusting the direct-current bias voltage in the signal line, the actual dielectric constant approaches the target equivalent dielectric constant, for example, making the actual dielectric constant equal to the target equivalent dielectric constant, thus reducing or even eliminating the deviation of phase shift degree caused by the influence of the microwave signal or external environment on the liquid crystal layer, achieving the compensation of phase shift degree, and improving the accuracy of adjusting, by the phase shifter, the phase of the wave. For example, in the case where the actual dielectric constant is greater than the target equivalent dielectric constant, it is necessary to reduce the direct-current bias voltage in the signal line, so as to reduce the actual dielectric constant; and in the case where the actual dielectric constant is less than the target equivalent dielectric constant, it is necessary to increase the direct-current bias voltage in the signal line, so as to increase the actual dielectric constant. The target equivalent dielectric constant is the equivalent dielectric constant corresponding to the ideal deflection angle of liquid crystal molecules under ideal conditions.

For example, in step S14, adjusting the direct-current bias voltage includes reducing the direct-current bias voltage in the case where the actual dielectric constant is greater than the target dielectric constant; and increasing the direct-current bias voltage in the case where the actual dielectric constant is less than the target dielectric constant. Therefore, the actual dielectric constant gradually approaches the target equivalent dielectric constant, and finally the actual dielectric constant is approximately equal to the target equivalent dielectric constant, thus achieving the compensation of the phase shift degree and improve the accuracy of adjusting, by the phase shifter, the phase of the wave.

For example, in step S13, detecting the actual dielectric constant of the liquid crystal layer includes after inputting a second input alternating current microwave signal to an input line of the resonant circuit, detecting to obtain the actual dielectric constant of the liquid crystal layer according to the second input alternating current microwave signal input to the input line and a second output alternating current microwave signal output by the output line of the resonant circuit.

For example, the second input alternating current microwave signal input to the input line and the second output alternating current microwave signal output by the output line can be input to the vector analyzer of the resonant circuit for vector analysis to obtain an analysis result, and then the analysis result is processed by the processor 123 (FIG. 4B) to obtain the actual dielectric constant of the liquid crystal layer. For another example, the transmission coefficient curve of the second output alternating current microwave signal and the transmission coefficient curve of the known dielectric constant can also be fitted by a simulation method, and the dielectric constant corresponding to the transmission coefficient curve, which coincides with the transmission coefficient curve of the second output alternating current microwave signal, of the known dielectric constant is taken as the actual dielectric constant of the liquid crystal layer.

The above description is only the preferred embodiments of the present disclosure and a description of the applied technical principles. Those skilled in the art should understand that the scope of the invention involved in the present disclosure is not limited to the technical scheme formed by the specific combination of the above technical features, but also covers other technical schemes formed by any combination of the above technical features or their equivalent features without departing from the inventive concept. For example, the technical scheme is formed by replacing the above features with the technical features with similar functions disclosed (but not limited to) in the present disclosure.

What is claimed is:

1. A phase shifter, comprising a first substrate and a second substrate that are oppositely arranged,
    wherein a resonant circuit, a signal line, and a first alignment layer are on a side of the first substrate facing the second substrate, a conductive layer and a second alignment layer are on a side of the second substrate facing the first substrate, and a liquid crystal layer is between the first alignment layer and the second alignment layer; and
    the resonant circuit is configured to detect an actual dielectric constant of the liquid crystal layer.

2. The phase shifter according to claim 1, wherein the resonant circuit comprises an input line, a resonant structure, and an output line, a first coupling capacitor is electrically connected between the input line and the resonant structure, and a second coupling capacitor is electrically connected between the resonant structure and the output line.

3. The phase shifter according to claim 2, wherein the resonant structure is between the input line and the output line in a direction parallel to the first substrate.

4. The phase shifter according to claim 3, wherein the resonant structure comprises a metal strip, and in a direction parallel to the first substrate, a first end of the metal strip is electrically connected to the first coupling capacitor and a second end of the metal strip is electrically connected to the second coupling capacitor.

5. The phase shifter according to claim 3, wherein the resonant circuit further comprises a microwave source, a vector analyzer, and a processor,
 the microwave source is configured to output a second input alternating current microwave signal to the input line and the vector analyzer,
 the vector analyzer is configured to receive a second output alternating current microwave signal output from the output line, and analyze the second input alternating current microwave signal and the second output alternating current microwave signal to obtain an analysis result; and
 the processor is configured to process the analysis result to obtain the actual dielectric constant.

6. The phase shifter according to claim 1, wherein in a direction perpendicular to the first substrate, the resonant circuit and the signal line are between the first alignment layer and the first substrate, and are covered by the first alignment layer.

7. The phase shifter according to claim 1, wherein in a direction perpendicular to the second substrate, the conductive layer is between the second alignment layer and the second substrate, and is covered by the second alignment layer.

8. The phase shifter according to claim 1, wherein the conductive layer is grounded.

9. The phase shifter according to claim 2, wherein the resonant structure comprises a metal strip, and in a direction parallel to the first substrate, a first end of the metal strip is electrically connected to the first coupling capacitor and a second end of the metal strip is electrically connected to the second coupling capacitor.

10. The phase shifter according to claim 2, wherein the resonant circuit further comprises a microwave source, a vector analyzer, and a processor,
 the microwave source is configured to output a second input alternating current microwave signal to the input line and the vector analyzer,
 the vector analyzer is configured to receive a second output alternating current microwave signal output from the output line, and analyze the second input alternating current microwave signal and the second output alternating current microwave signal to obtain an analysis result; and
 the processor is configured to process the analysis result to obtain the actual dielectric constant.

11. The phase shifter according to claim 2, wherein in a direction perpendicular to the first substrate, the resonant circuit and the signal line are between the first alignment layer and the first substrate, and are covered by the first alignment layer.

12. A phase shift degree compensation device, applied to a phase shifter, wherein the phase shifter comprises a first substrate and a second substrate that are oppositely arranged,
 a resonant circuit, a signal line, and a first alignment layer are on a side of the first substrate facing the second substrate, a conductive layer and a second alignment layer are on a side of the second substrate facing the first substrate, and a liquid crystal layer is between the first alignment layer and the second alignment layer; and
 the resonant circuit is configured to detect an actual dielectric constant of the liquid crystal layer,
 the phase shift degree compensation device comprises a loading circuit, an acquisition circuit, and a control circuit,
 the loading circuit is configured to load a direct-current bias voltage and a first alternating current microwave signal in the signal line of the phase shifter,
 the acquisition circuit is configured to acquire a target equivalent dielectric constant of the liquid crystal layer of the phase shifter according to the direct-current bias voltage;
 the resonant circuit is configured to detect the actual dielectric constant of the liquid crystal layer of the phase shifter; and
 the control circuit is configured to adjust the direct-current bias voltage according to the target equivalent dielectric constant and the actual dielectric constant, to make the actual dielectric constant approach the target equivalent dielectric constant.

13. The phase shift degree compensation device according to claim 12, wherein the control circuit is configured to reduce the direct-current bias voltage in a case where the actual dielectric constant is greater than the target equivalent dielectric constant and increase the direct-current bias voltage in a case where the actual dielectric constant is less than the target equivalent dielectric constant.

14. The phase shift degree compensation device according to claim 12, wherein in a case where the resonant circuit comprises an input line, a resonant structure, and an output line, the resonant circuit is configured to, after inputting a second input alternating current microwave signal to the input line, obtain the actual dielectric constant of the liquid crystal layer according to the second input alternating current microwave signal and a second output alternating current microwave signal output by the output line.

15. The phase shift degree compensation device according to claim 14, wherein in a case where the resonant circuit further comprises a microwave source, a vector analyzer, and a processor,
 the microwave source is configured to output the second input alternating current microwave signal to the input line and the vector analyzer,
 the vector analyzer is configured to receive the second output alternating current microwave signal output from the output line and analyze the second input alternating current microwave signal and the second output alternating current microwave signal to obtain an analysis result; and
 the processor is configured to process the analysis result to obtain the actual dielectric constant.

16. A phase shift degree compensation method, applied to a phase shift degree compensation device,
 wherein the phase shift degree compensation device is applied to a phase shifter, the phase shifter comprises a first substrate and a second substrate that are oppositely arranged,
 a resonant circuit, a signal line, and a first alignment layer are on a side of the first substrate facing the second substrate, a conductive layer and a second alignment layer are on a side of the second substrate facing the first substrate, and a liquid crystal layer is between the first alignment layer and the second alignment layer; and the resonant circuit is configured to detect an actual dielectric constant of the liquid crystal layer, the phase shift degree compensation device comprises a loading circuit, an acquisition circuit, and a control circuit, the loading circuit is configured to load a direct-current bias voltage and a first alternating current microwave signal in the signal line of the phase shifter, the acquisition circuit is configured to acquire a target equivalent dielectric constant of the liquid crystal layer of the phase shifter according to the direct-current bias voltage;

the resonant circuit is configured to detect the actual dielectric constant of the liquid crystal layer of the phase shifter; and the control circuit is configured to adjust the direct-current bias voltage according to the target equivalent dielectric constant and the actual dielectric constant, to make the actual dielectric constant approach the target equivalent dielectric constant the phase shift degree compensation method comprises:

loading the direct-current bias voltage and the first alternating current microwave signal into the signal line;

acquiring the target equivalent dielectric constant of the liquid crystal layer according to the direct-current bias voltage;

detecting the actual dielectric constant of the liquid crystal layer; and adjusting the direct-current bias voltage according to the target equivalent dielectric constant and the actual dielectric constant, to make the actual dielectric constant approach the target equivalent dielectric constant.

17. The phase shift degree compensation method according to claim 16, wherein detecting the actual dielectric constant of the liquid crystal layer comprises:

after inputting a second input alternating current microwave signal to an input line of the resonant circuit, detecting the actual dielectric constant of the liquid crystal layer according to the second input alternating current microwave signal and a second output alternating current microwave signal output by an output line of the resonant circuit.

18. The phase shifter according to claim 11, wherein in a direction perpendicular to the second substrate, the conductive layer is between the second alignment layer and the second substrate, and is covered by the second alignment layer.

19. The phase shift degree compensation method according to claim 16, wherein adjusting the direct-current bias voltage comprises:

in a case where the actual dielectric constant is greater than the target equivalent dielectric constant, reducing the direct-current bias voltage; and in a case where the actual dielectric constant is less than the target equivalent dielectric constant, increasing the direct-current bias voltage.

20. The phase shift degree compensation method according to claim 19, wherein detecting the actual dielectric constant of the liquid crystal layer comprises:

after inputting a second input alternating current microwave signal to an input line of the resonant circuit, detecting the actual dielectric constant of the liquid crystal layer according to the second input alternating current microwave signal and a second output alternating current microwave signal output by an output line of the resonant circuit.

* * * * *